(12) United States Patent
Lesso et al.

(10) Patent No.: US 11,121,690 B2
(45) Date of Patent: Sep. 14, 2021

(54) CLASS D AMPLIFIER CIRCUIT

(71) Applicant: Cirrus Logic International Semiconductor Ltd., Edinburgh (GB)

(72) Inventors: John Paul Lesso, Edinburgh (GB); Toru Ido, Yokohama (JP)

(73) Assignee: Cirrus Logic, Inc., Austin, TX (US)

( * ) Notice: Subject to any disclaimer, the term of this patent is extended or adjusted under 35 U.S.C. 154(b) by 68 days.

(21) Appl. No.: 16/552,843

(22) Filed: Aug. 27, 2019

(65) Prior Publication Data

US 2019/0386626 A1 Dec. 19, 2019

Related U.S. Application Data

(63) Continuation of application No. 15/886,103, filed on Feb. 1, 2018, now Pat. No. 10,461,714, which is a
(Continued)

(30) Foreign Application Priority Data

Aug. 29, 2014 (GB) ...................................... 1415328

(51) Int. Cl.
*H03F 3/217* (2006.01)
*H03G 3/30* (2006.01)
(Continued)

(52) U.S. Cl.
CPC ............. *H03G 3/3089* (2013.01); *H03F 1/26* (2013.01); *H03F 1/32* (2013.01); *H03F 1/34* (2013.01);
(Continued)

(58) Field of Classification Search
CPC ...... H03G 3/3089; H03G 7/002; H03G 7/007; H03F 1/34; H03F 1/26; H03F 1/32;
(Continued)

(56) References Cited

U.S. PATENT DOCUMENTS 6,373,334 B1 4/2002 Melanson
7,362,254 B2 4/2008 Kost
(Continued)

FOREIGN PATENT DOCUMENTS

CN 101160717 A 4/2008
EP 1653604 A1 5/2006
(Continued)

OTHER PUBLICATIONS

First Office Action, China National Intellectual Property Administration, Application No. 2015800580565, dated Jan. 10, 2020.
(Continued)

*Primary Examiner* — Khanh V Nguyen
(74) *Attorney, Agent, or Firm* — Jackson Walker L.L.P.

(57) ABSTRACT

This application relates to Class D amplifier circuits. A modulator controls a Class D output stage based on a modulator input signal (Dm) to generate an output signal (Vout) which is representative of an input signal (Din). An error block, which may comprise an ADC, generates an error signal (ε) from the output signal and the input signal. In various embodiments the extent to which the error signal (ε) contributes to the modulator input signal (Dm) is variable based on an indication of the amplitude of the input signal (Din). The error signal may be received at a first input of a signal selector block. The input signal may be received at a second input of the signal selector block. The signal selector block may be operable in first and second modes of operation, wherein in the first mode the modulator input signal is based at least in part on the error signal; and in the second mode the modulator input signal is based on the digital input signal and is independent of the error signal. The error signal can be used to reduce distortion at high signal levels but is not used at low signal levels and so the noise floor at low
(Continued)

signal levels does not depend on the component of the error block.

17 Claims, 5 Drawing Sheets

Related U.S. Application Data continuation of application No. 15/466,661, filed on Mar. 22, 2017, now Pat. No. 9,899,978, which is a continuation of application No. 14/836,006, filed on Aug. 26, 2015, now Pat. No. 9,628,040.

(51) Int. Cl.
| | | |
|---|---|---|
| *H03F 1/26* | (2006.01) | |
| *H03F 1/32* | (2006.01) | |
| *H03F 3/187* | (2006.01) | |
| *H03F 1/34* | (2006.01) | |
| *H03G 7/00* | (2006.01) | |

(52) U.S. Cl.
CPC ............ *H03F 3/187* (2013.01); *H03F 3/217* (2013.01); *H03F 3/2175* (2013.01); *H03G 7/002* (2013.01); *H03G 7/007* (2013.01); *H03F 3/2171* (2013.01); *H03F 3/2173* (2013.01); *H03F 2200/102* (2013.01); *H03F 2200/339* (2013.01); *H03F 2200/432* (2013.01)

(58) Field of Classification Search
CPC ........ H03F 3/187; H03F 3/2175; H03F 3/217; H03F 3/2171; H03F 3/2173; H03F 2200/432; H03F 2200/339; H03F 2200/102; H03F 2200/351
USPC ........................................ 330/10, 207 A, 251
See application file for complete search history.

(56) References Cited

U.S. PATENT DOCUMENTS

| | | | |
|---|---|---|---|
| 7,518,444 | B2 | 4/2009 | Andersen et al. |
| 7,990,215 | B2 | 8/2011 | Soenen |
| 8,228,117 | B2 * | 7/2012 | Midya .................. H03G 3/348 |
| | | | 330/10 |
| 9,467,097 | B2 | 10/2016 | Kaya |
| 9,503,027 | B2 | 11/2016 | Zanbaghi |
| 2007/0183490 | A1 | 8/2007 | Andersen et al. |
| 2009/0027118 | A1 | 1/2009 | Andersen et al. |
| 2009/0160553 | A1 | 6/2009 | Wei |
| 2010/0219891 | A1 | 9/2010 | Tsuchiya |

FOREIGN PATENT DOCUMENTS

| | | |
|---|---|---|
| EP | 2587665 A1 | 5/2013 |
| GB | 2421648 A | 6/2006 |
| GB | 2515526 A | 12/2014 |
| JP | 2005006093 A | 1/2005 |
| JP | 2007110646 A | 4/2007 |
| WO | 2006109235 A1 | 10/2006 |

OTHER PUBLICATIONS

Combined Search and Examination Report under Sections 17 and 18(3), UKIPO, Application No. GB1802108.9, dated Aug. 7, 2018.
International Search Report and Written Opinion, International Patent Application No. PCT/GB2015/052444, dated Nov. 5, 2015, 12 pages.
Combined Search and Examination Report under Sections 17 and 18(3), UK Patent Application No. GB1415328.2, dated Aug. 30, 2016, 6 pages.
Combined Search and Examination Report, UKIPO, Application No. GB1703298.8, dated Sep. 1, 2017.

* cited by examiner

CLASS D AMPLIFIER CIRCUIT

The present application is a continuation of U.S. Nonprovisional patent application Ser. No. 15/886,103, filed Feb. 1, 2018, issued as U.S. Pat. No. 10,461,714 on Oct. 29, 2019, which is a continuation of U.S. Nonprovisional patent application Ser. No. 15/466,661, filed Mar. 22, 2017, issued as U.S. Pat. No. 9,899,978 on Feb. 20, 2018, which is a continuation of U.S. Nonprovisional patent application Ser. No. 14/836,006, filed Aug. 26, 2015, issued as U.S. Pat. No. 9,628,040 on Apr. 18, 2017, which claims priority to British Patent Application No. 1415328.2 filed on Aug. 29, 2014, each of which is incorporated by reference herein in its entirety.

This invention relates to Class D amplifier circuits and especially to a Class D amplifier that selectively varies the signal components used to drive an amplifier output stage based on signal amplitude.

FIG. 1 illustrates an example of a conventional Class D amplifier. A modulator 101 controls a Class D output stage 102 to generate an output signal Vout based on an input signal, which in this example is a digital input signal Din. The output stage 102 comprises a plurality of switches for switching the output stage 102 between a plurality of voltages, for example a supply voltage VDD and ground, or positive and negative supply voltages +VDD and −VDD. The output stage 102 may comprise a half-bridge or full-bridge switch arrangement, as will understood by one skilled in the art, and is switched to output an analogue output signal Vout, which may in some embodiments be a differential output signal.

The modulator 101 receives an input signal which in this example is a digital input signal Din and derives at least one appropriate control signal for the output stage 102. A standard digital modulator 101 has a well-defined, transfer function, for instance flat and with a defined gain over some pass-band range of frequency. Ideally this digital-domain signal processing gives high performance and avoids analogue circuitry with its non-zero signal degradation associated with noise, component mismatch and non-linearity.

However, the output signal Vout is an analogue signal and its performance is limited by analogue effects in any output driver stage of the amplifier. For example, output driver transistor on-resistance, finite rise and fall times, propagation delays, power supply ripples and output impedance. In addition, any power supply ripple will cause a proportional gain variation of the output driver stage.

Negative feedback techniques are typically used to suppress signal distortion arising from these causes. The Class D amplifier of FIG. 1 thus has a feedback path comprising an analogue-to-digital converter (ADC) 103 and subtractor 104.

The ADC 103 is adapted to receive the analogue output signal Vout and produce a digital signal representative of this output signal. This digital signal is then subtracted from the digital input signal Din by the subtractor 104 to produce an error signal. A loop filter 105, which may be for example a digital integrator, filters the error signal to generate the modulator input signal which is supplied to the digital modulator 101.

The performance of such an amplifier circuit is limited by the noise, resolution and linearity of the ADC 103. To avoid introducing unwanted noise into the amplifier circuit, the ADC has to have good noise characteristics which typically requires the use of a relatively high performance continuous-time ADC. Such an ADC is relatively large (in terms of silicon area in an integrated circuit) and has a relatively high power consumption in use.

Typically Class D amplifier circuits have been used in relatively high power applications, for instance mains-powered audio apparatus where size and power consumption are not critical. Increasingly however, Class D amplifiers are being considered for applications in portable devices and the like. With a move to smaller geometry silicon fabrication processes it is advantageous to use circuits which are mainly digital. A Class D amplifier may comprise a largely digital architecture and thus Class D amplifiers are being increasingly proposed for use driving small speakers, e.g. of a portable device or the like or even for earbud/headphone applications where the powers are typically relatively low. In such applications size and power efficiency are factors to be considered for the amplifier circuit.

It is therefore desirable to provide a Class D amplifier circuit that at least mitigates some of the above mentioned disadvantages.

According to the present invention there is provided a Class D amplifier circuit for receiving a digital input signal and outputting an analogue output signal comprising:
  a class-D output stage;
  a digital modulator for generating at least one control signal for controlling said class-D output stage based on a modulator input signal;
  an error block for generating an error signal based on said output signal and said digital input signal;
  a signal selector block configured to receive the error signal at a first input, receive a version of the digital input signal at a second input and generate the modulator input signal; wherein:
  said signal selector block is operable in a first mode and a second mode of operation, wherein:
  in the first mode the modulator input signal is based at least in part on the error signal; and
  in the second mode the modulator input signal is based on the digital input signal and is independent of the error signal; and
a signal selection controller configured to control the mode of operation of the signal selector block based on an indication of the amplitude of the digital input signal.

The signal selection block may comprise a first signal path between said first input and a selector module and a second signal path between said second input and said selector module. The selector module may be configured to generate the modulator input signal from the signals from first signal path and the second signal path.

The selector module may be operable in: a combiner state to combine the signal from the first signal path with the signal from the second signal path to provide the modulator input signal, and/or a pass-through state to provide the signal from the second signal path as the modulator input signal. The signal selection controller may be configured to control the selector module in the combiner state in the first mode and in the pass-through state in the second mode.

In some embodiments the selector module is configured to select either the signal from the first signal path or the signal from the second signal path to provide the modulator input signal. The signal selection controller may be configured to control the selector module to select the signal from the first signal path in the first mode and the signal from the second signal path in the second mode.

In some embodiments the second signal path comprises at least one variable gain element. The signal selection controller may be configured to control the at least one variable gain element to provide a first gain setting in the first mode and a second gain setting in the second mode. The second gain setting may be zero.

In some embodiments the signal selection controller is configured to control the at least one variable gain element to provide a controlled transition in gain between said first and second gain settings that involves at least one intermediate gain setting. The controlled transition in gain may comprise a ramp in gain.

In some embodiments the variable gain element comprises a multiplier.

The first signal path may comprise a loop filter. The at least one variable gain element may be located in the first signal path downstream of the loop filter. Additionally or alternatively in some embodiments the loop filter has a variable gain and the at least one variable gain element may comprise said loop filter. The loop filter may comprise an integrator and the signal selection controller may be configured to control the integrator time constant of said integrator to vary the gain of the loop filter. The signal selection controller may be configured to enable the loop filter in the first mode and disable the loop filter in the second mode.

In some embodiments the error block comprises an analogue to digital converter (ADC) coupled to receive the output signal. The error block may further comprise a subtractor which may generate the error signal based on the output of the ADC and the digital input signal. The signal selection controller may be configured to enable the analogue ADC in the first mode and disable the ADC in the second mode.

The amplifier circuit may further comprise an envelope detector for determining an envelope value for the digital input signal. The signal selection controller may be configured to use the envelope value as the indication of amplitude of the digital input signal.

The envelope detector may apply a predetermined delay between any drop in detected signal envelope and a reduction in the envelope value. In some embodiments the envelope detector receives a version of the digital input signal.

In some embodiments the signal selection controller is configured to receive an indication of a volume control setting and to use said indication of a volume control setting as the indication of the amplitude of the digital input signal.

The signal selection controller may be configured to transition from the first mode of operation to the second mode of operation if the indication of the amplitude of the digital input signal drops below a first amplitude threshold. It may also be configured to transition from the second mode of operation to the first mode of operation if the indication of the amplitude of the digital input signal rises above a second amplitude threshold. The first threshold may be the same as the second threshold or the thresholds may be different.

The signal selection controller may be configured to initiate any transition between the first and second modes at a time when the magnitude of the input signal is at or below a first magnitude level. The Class D amplifier circuit may comprise a low-level detector for detecting when the magnitude of the input signal is at or below the first magnitude level.

Embodiments also relate to integrated circuits comprising a Class D amplifier circuit as described in any of the variants above. Further embodiments relate to electronic devices comprising such integrated circuits or amplifier circuits as described in any variants above. The device may be at least one of a portable device; a battery power device; a computing device; a communications device; a gaming device; a mobile telephone; a personal media player; a laptop, tablet or notebook computing device.

According to another aspect of the invention there is provided a method of operating a Class D amplifier circuit comprising: receiving a digital input signal; and providing a modulator input signal to a digital modulator so as to control a class-D output stage to produce an output signal; wherein the method comprises selectively varying between a first mode of operation and a second mode of operation based on an indication of the amplitude of the digital input signal; wherein, in the first mode of operation, the modulator input signal is based, at least partly, on an error signal, the error signal being generated based on said output signal and said digital input signal; and in the second mode of operation, the modulator input signal is based on the digital input signal and is independent of the error signal.

In a further aspect of the invention there is provided a Class-D amplifier circuit for receiving an input signal and outputting an output signal, said amplifier circuit comprising: a class-D output stage; a controller for generating at least one control signal for controlling said output stage; and an error block for deriving an error signal from said output signal and said input signal; wherein said controller is operable in a first mode of operation where said at least one control signal is based at least partly on said error signal and also in a second mode of operation where said at least one control signal is based on said input signal and does not include any contribution from said error signal; and wherein said controller is configured to selectively vary between said first and second modes of operation based on an indication of the amplitude of the input signal.

In a further aspect there is provided a Class-D amplifier circuit that changes between open-loop and closed-loop operation based on an indication of input signal amplitude.

In a further aspect of the invention there is provided a Class-D amplifier circuit that controllably transitions between an open-loop operational mode and a closed-loop operational mode in response to a characteristic of the amplitude of an input signal.

In a further aspect of the invention there is provided a Class-D amplifier circuit for amplifying an input signal that selectively transitions between an open-loop operational mode and a closed-loop operational mode in response to a characteristic of the amplitude of said input signal.

In a further aspect of the invention there is provided a Class D amplifier circuit for receiving a digital input signal and outputting an analogue output signal comprising:
  a class-D output stage;
  a digital modulator for generating at least one control signal for controlling said class-D output stage based on a modulator input signal;
  an error block for generating an error signal, said error block comprising an analogue to digital converter for receiving an indication of said analogue output signal and a subtractor for generating said error signal based on the output of the analogue to digital converter and the digital input signal;
  a signal selector block comprising:
    a selector module;
    a first signal path between a first input for receiving the error signal and the selector module; and
    a second signal path between a second input for receiving the digital input signal and said selector module;
  wherein the selector module is configured to generate the modulator input signal from the signals from first signal path and the second signal path; and a signal selection controller configured to vary a gain applied in said first signal path based on an indication of the amplitude of the digital input signal.

In a further aspect of the invention there is provided a Class D amplifier circuit for receiving an amplifier input signal and outputting an output signal comprising: a class-D output stage; a modulator for generating at least one control signal for controlling said class-D output stage based on a modulator input signal; an error block for generating an error signal, based on said output signal and said amplifier input signal; a signal selector block configured to receive the error signal at a first input and the digital input signal at a second input and to generate the modulator input signal; and a signal selection controller configured to control the amplifier circuit to vary the extent to which the error signal contributes to the modulator input signal based on an indication of the amplitude of the digital input signal.

DETAILED DESCRIPTION

As mentioned previously a Class D amplifier for receiving an input signal and generating an output signal typically comprises a modulator for controlling a Class D output stage based on a modulator input signal. An error block, which may for instance comprise an ADC and a subtractor in a feedback path, may be provided to generate an error signal which is based on the output signal and the input signal, e.g. the difference between the converted version of the output signal and the input signal. Embodiments of the present invention relate to Class D amplifier circuits in which the extent of the contribution of the error signal to the modulator input signal is variable based on an indication of the amplitude of the input signal. In some embodiments the amplifier circuit may be selectively variable between at least two modes of operation based on the amplitude of the input signal. In a first mode of operation the modulator input signal may be based at least in part on the error signal. In a second mode of operation the modulator input signal may be based on the input signal but may be independent of the error signal. At relatively high signal amplitudes the amplifier may operate in the first mode of operation and at relatively low signal amplitudes the amplifier may operate in the second mode, e.g. an open loop mode of operation.

Thus at high signal levels the error signal is used to help reduce any distortion in the output signal. At low signal levels however the extent of any distortion is not so significant and thus the feedback error signal is not used. As the error signal is only used at relatively high signal levels the noise requirements for the components of the error block, such as the ADC, are relaxed compared with a conventional implementation where the error signal is always used during steady state operation. In effect at low signal levels, where the noise floor of the amplifier circuit is more noticeable, the error signal is not used. This means for example that a smaller and/or lower power ADC may be implemented in the error block than otherwise would be required, thus reducing the size and/or increasing power efficiency of the amplifier circuit but without any significant reduction in signal quality or noise performance. In some embodiments, as will be described in more detail later, some components associated with generating or processing the error signal may even be disabled in the second mode of operation to provide additional power savings.

Figure 1:
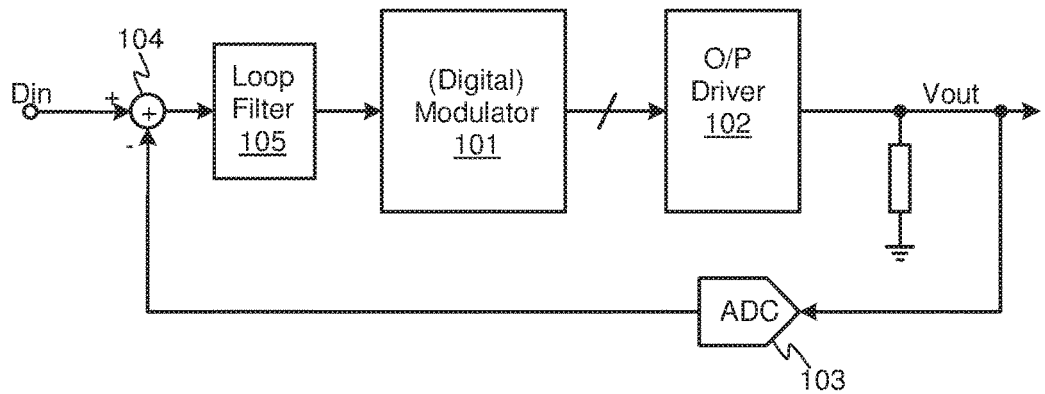
FIG. 1 illustrates an example of a known Class D amplifier circuit.
Figure 2:
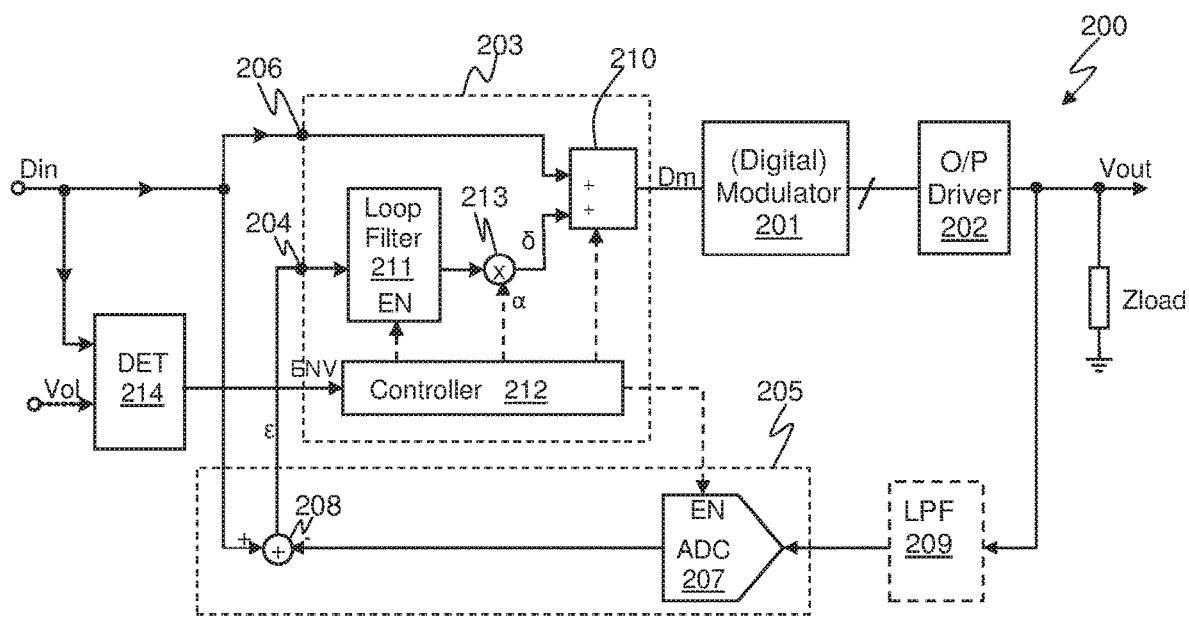
FIG. 2 illustrates a Class D amplifier circuit according to an embodiment of the invention.

FIG. 2 illustrates a Class D amplifier circuit, generally indicated as 200, according to an embodiment of the invention. A modulator 201, which in this example is a digital modulator, controls a Class D output driver stage 202 as described above with respect to FIG. 1. In some embodiments, the output driver stage 202 may be a full H-bridge or a half-bridge class D amplifier output stage or any other suitable amplifier output stage.

In the embodiment of FIG. 2 the input to the digital modulator 201 is a modulator input signal, Dm, received from a signal selector block 203. The signal selector block 203 receives, at a first input 204, an error signal E from an error block 205. The signal selector block also receives a version of the digital input signal Din at a second input 206.

The error block 205 generates the error signal E from the digital input signal Din and the analogue output signal Vout. In this example, the error signal is based on a comparison between the digital input signal Din and the analogue output signal Vout.

As illustrated in FIG. 2 the error block 205 may comprise an analogue-to-digital converter (ADC) 207 which receives the analogue output signal Vout and outputs a digital signal representative of the analogue output signal. A digital subtractor 208 receives the output of the ADC 207 and also a version of the digital input signal Din and generates the error signal ε. In some embodiments, the analogue output signal Vout may be filtered by a low pass filter 209 before it is input into the ADC 207. This helps to provide suppression of any high frequency signals and transients at the output, to avoid them being mixed down to audio frequencies by imperfections of the ADC.

The signal selector block 203 is operable to autonomously vary the extent to which the error signal ε contributes to the modulator input signal Dm based on an indication of the amplitude of the digital input signal Din. In one embodiment the signal selector block 203 is operable in two modes of operation. In a first mode the modulator input signal Dm is based at least partly on the error signal. The first mode therefore corresponds to a closed loop mode of operation of the amplifier circuit. In a second mode however the modulator input signal Dm is based on the digital input signal Din and is independent of the error signal ε. The second mode thus corresponds to an open loop mode of operation of the amplifier circuit.

The signal selector block 203 thus comprises a first signal path between its first input 204 and a first input of a selector module 210 and a second signal path between its second input 206 and a second input of the selector module 210. The selector module 210 is configured to take the signals from one or both of the first and second signal paths to provide the modulator input signal Dm. The signal selector module 210 may be implemented in various ways as will be described in more detail later.

The first signal path is thus a signal path for the error signal ε. This signal path may comprise a loop filter 211 for filtering the error signal in a similar fashion as described above in relation to FIG. 1. The open-loop gain of the loop comprising loop filter 211 should preferably be high at audio frequencies and yet also remain stable at higher frequencies. The loop filter 211 may thus for instance be a first order integrator, or possibly a higher order filter, with a high gain at the audio signal band and a low gain at higher frequencies.

The second signal path is a signal path for the digital input signal Din. FIG. 2 illustrates no signal processing in the second signal path but there may be one or more signal conditioning components such as a filter located in this signal path if required.

As mentioned above the signal selection block 203 is operable in a first mode where the modulator input signal is based, at least partly on the error signal. Thus in the first mode of operation there is an error signal contribution from the first signal path to the modulator input signal Dm. In the second mode of operation the modulator input signal is based on the digital input signal Din and is independent of the error signal, thus in the second mode of operation there is an input signal contribution from the second signal path to the modulator input signal Dm and effectively no signal contribution from the first signal path (at least no signal contribution that corresponds to the error signal).

There are various ways in which the first and second modes of operation may be enabled and, as mentioned above, the selector module 210 may take various forms. For example in some embodiments the selector module may receive signal contributions from both the first and second signal paths and may select either the signal from the first signal path or the second from the second signal path to provide the modulator input signal Dm. The selector module 210 may therefore comprise a switch module switching its output between the two signal paths. The selector module 210 may be controlled by a signal selection controller 212. The switch module could comprise one or more physical switch elements and/or may be implemented by a digital switch which may be a physical multiplexer comprising combinatorial logic elements or may, for instance, change the address of a register from which the signal data is acquired from. In such embodiments therefore the signal from the first signal path, e.g. the filtered error signal, is used in the first mode (without a contribution from the second signal path) and the signal from the second signal path, e.g. the digital input signal Din, is used in the second mode without any contribution from the first signal path. In such an embodiment however there could be a gross transient in switching between modes, for instance as the loop filter settles out following a change to the first mode or as an error component is removed when switching to the second mode.

In some embodiments therefore the selector module 210 may be a combiner for, at least in the first mode, combining the signals from the first and second signal paths to provide the modulator input signal Dm. In the first mode the selector module 210 may therefore be a combiner which functions as an adder. In such an embodiment the filtered error signal from the first signal path may be added to the input signal from the second signal path in the first mode. In the second mode the signal from the second signal path may be the only contribution to the modulator input signal Dm.

The combiner selector module 210 may therefore be operable in two states: State 1 which is a combiner state of operation to combine the signals from the first and second signal paths in the first mode and State 2 which is a pass-through state of operation in which only the signal from the second signal path is used. The relevant state of operation of the selector module 210 may be controlled by the controller 212. Additionally or alternatively the amplifier circuit could be configured so that no signal dependent contribution of the error signal is received at the selector module 210 in the second mode. In other words in the second mode the signal from the second signal path received at the combiner selector module 210 has a constant, non signal dependent, quiescent value, e.g. zero. In which case the selector module 210 may comprise a simple adder or the like. The adder may operate in the same way in the first and second modes but in the second mode there is no signal component received at the adder from the error signal and thus the modulator input signal Dm will be independent of the error signal. In some embodiments however it may be preferred for the controller 212 to operate the combiner selector module 210 in a pass-through state in the second mode of operation, even when there is no signal dependent contribution received from the second signal path, to avoid the computational expense of repeatedly adding zero to the signal from the first signal path.

There are various ways in which the contribution of the error signal to the input of the selector module 210 may be removed. For instance, the signal in the first signal path may be effectively blocked or attenuated to zero in the second mode. In some embodiments there may be at least one variable gain element 213 located in the first signal path that applies a controlled gain. The signal selection controller 212 may be configured to control the at least one variable gain element 213 to provide a first gain setting in the first mode, which is a nominal non-zero gain setting. In the second mode the gain may be set to zero. Additionally or alternatively the loop filter 211 may have a variable gain which can be set to zero by the controller 212 in the second mode of operation.

In some embodiments no error signal may be generated in the second mode of operation. For instance the one or more components of the error block 205 could be controlled such that the output of the error block is a constant zero so that there is no error signal received at the first input of the signal selector block 203 in the second mode of operation, and thus no error signal dependent contribution received at the selector module.

It will therefore be clear that in some embodiments when the signal selection block 203 is operating in the first mode the (signal dependent) error signal is added to the input signal from the second signal path to form the modulator input signal Dm. However in the second mode only the input signal from the second signal path is used for the modulator input signal. In such embodiments any gross transient involved in switching between modes is likely to be lower than that discussed above in relation to embodiments that simply step change between using only the input signal or only the error signal.

In some embodiments, to minimise or eliminate any unwanted transients, there may be a controlled transition in gain applied in the first signal path during a mode change between the first and second modes. For example as mentioned there may be a variable gain element in the first signal path, such as digital multiplier 213. FIG. 2 illustrates the variable gain element 213 located downstream of the loop filter 211 but equally a gain element could additionally or alternatively be located upstream of the loop filter 211 and/or, as mentioned, the gain of the loop filter 211 may itself be variable. The signal selection controller 212 may be configured to control the at least one variable gain element, e.g. multiplier 213, to provide said a first, non-zero gain setting in the first mode and a second gain setting in the second mode. The second gain setting may be zero but in some embodiments may be a non-zero gain setting which is lower than the first gain setting. The variable gain element may be controlled to provide a controlled transition in gain between the first and second gain settings that involves at least one intermediate gain setting. For instance there may be a ramp in gain over a certain time period. For example consider that the signal selector block changes mode from the first mode of operation to the second mode of operation. In the first mode of operation the gain applied to the first signal path is at the first gain setting. The controller 212 may then initiate a controlled transition in gain during the mode change to the second mode. The gain applied by multiplier 213 may then be controllably ramped down over a defined period of time to the second gain setting. The second gain setting may be zero in which case the second mode is enabled when the gain reaches zero. In other embodiments however the second gain setting may be a small but non-zero gain setting which is low enough that there will be no significant transients if the selector module 210 is switched to the pass-through state in the second mode of operation.

The signal selection controller 212 determines whether to operate in the first or second modes of operation based on an indication of the amplitude of the digital input signal Din. In some embodiments, as illustrated in FIG. 2, an envelope detector 214 may be provided to derive an envelope value ENV for the digital input signal, which is provided to the controller 212. In some embodiments the envelope detector 214 may receive the digital input signal Din. In some embodiments however a signal from a signal path from the amplifier circuit could be used to determine an envelope value instead, for instance a signal derived from the modulator 201. It should be appreciated however that alternatively an indirect indication of the amplitude of the digital input signal Din could be provided, for example a volume control signal Vol could be taken as an indication of a maximum amplitude. In other arrangements a signal such as an envelope value may be determined upstream and supplied to the amplifier circuit, or the downstream loading characteristics could be used as an indication of signal amplitude.

In the embodiment of FIG. 2 the controller 212 receives the envelope value ENV and determines whether to operate in the first mode of operation or the second mode of operation. If ENV indicates the input signal has a relatively large amplitude the first mode of operation is selected, i.e. a closed loop mode of operation for the amplifier. If ENV indicates that the input signal has a relatively small amplitude then the second mode of operation is selected i.e. in this embodiment, an open loop mode of operation.

In some embodiments the signal selection controller 212 may be configured to transition from the first mode of operation to the second mode of operation if the envelope value, i.e. the indication of the amplitude of the digital input signal Din, drops below a first amplitude threshold, and to transition from the second mode of operation to the first mode of operation if the envelope value rises above a second amplitude threshold. The first and second amplitude thresholds may be the same or may be different, for instance to apply some hysteresis.

Therefore, when the signal is relatively low the error signal is not used, as the low amplitude input signal results in an output signal which is less affected by any intrinsic distortion in the output driver stage, e.g. caused by any potential power supply ripples or other sources of error. The noise floor of the amplifier system is thus mainly determined by the digital modulator 201 which can be designed accordingly. When the amplitude of the digital input signal Din is relatively high however, the output signal will suffer more intrinsic distortions. Therefore, at higher amplitudes the amplifier operates in the closed loop mode so that the error caused by these distortions can be reduced. The components of the error block such as the ADC 207 are thus designed to reduce distortion etc. at higher signal levels. At higher signal levels the noise floor performance of the ADC 207 is less important however, and thus the ADC 207 can be designed with relaxed constraints compared to a conventional Class D amplifier with such a feedback loop that always operates in steady state operation. This dual mode, i.e. open/closed loop, operation of the Class D amplifier advantageously allows the use of a smaller ADC and/or an ADC that consumes less power than would otherwise be the case. By being able to switch between the closed loop and open loop modes of operation the system as a whole enables the power consumption of the ADC to be optimised whilst still maintaining a high performance response. Furthermore, being able to transition in a controlled manner between the closed loop and open loop modes of operation advantageously minimises any output signal artefacts.

Figure 3:
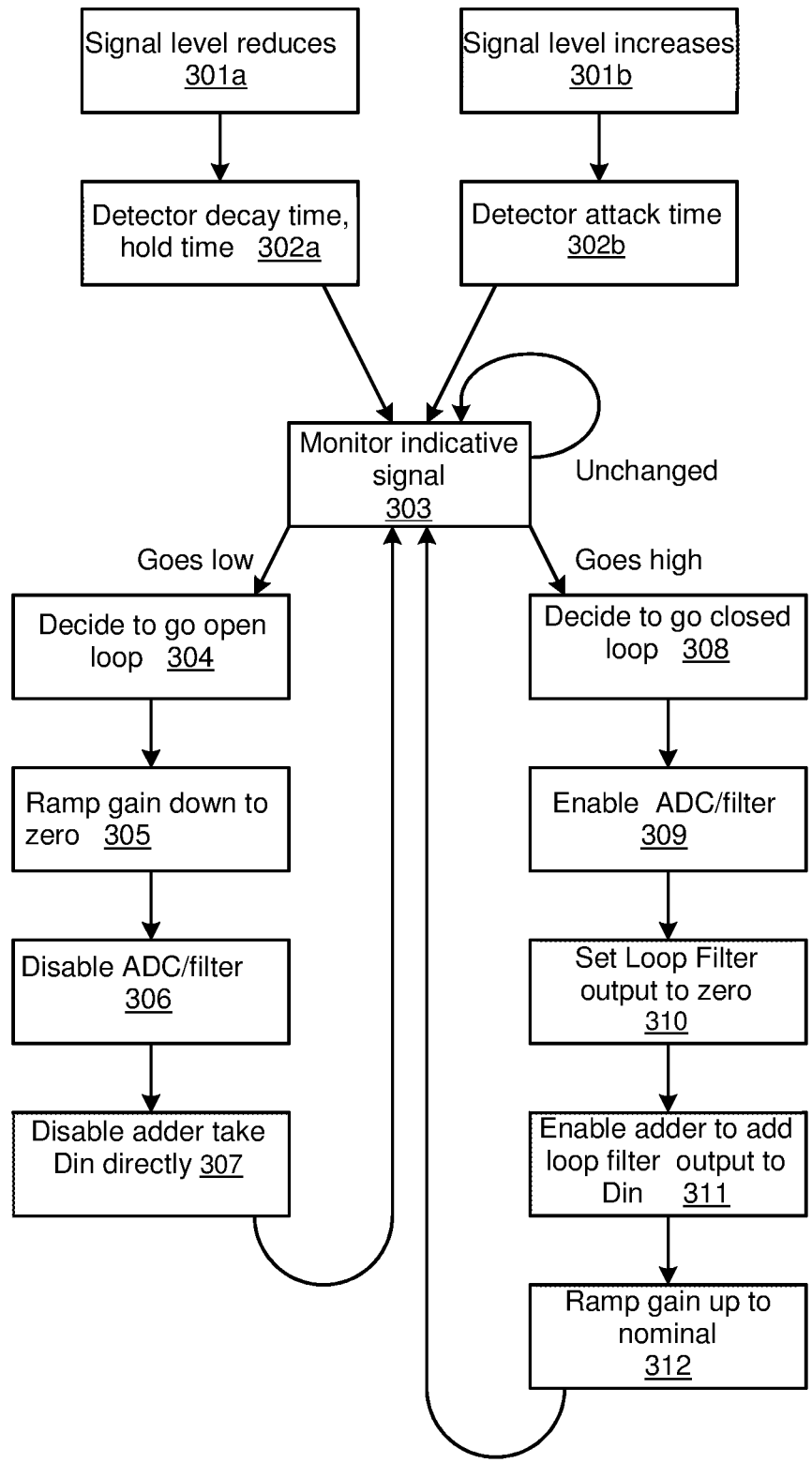
FIG. 3 illustrates a flow chart of one example of a method of swapping between first and second modes of operation.

FIG. 3 illustrates a flow chart of one example of how the amplifier illustrated in FIG. 2 may transition between modes according to an embodiment of the invention.

If the signal peak level reduces 301a, the envelope detector value ENV may decrease 302a in accordance with a decay time constant, and possibly a hold time of the envelope detector. To avoid changing between modes unnecessarily often the envelope detector 214 may apply a hold time before reducing the envelope value in response to a reduction in peak signal level and may apply a relatively slow decay constant. If the signal peak level increases 301b, the envelope detector value ENV may increase 302b in accordance with an attack time constant. If the envelope detector block 214 employs a relatively short attack time, this will ensure that rapid spikes in the digital input signal Din will result in a rapid reaction by the envelope detection circuitry 214 and thus a rapid response can be made so as to transfer to a closed loop mode of operation, and ensure that the feedback loop is implemented to reduce any error caused by the higher signal in the output driver stage. In contrast, the long decay time will avoid unnecessary switching of the operation modes as it is quite likely that one high-amplitude signal peak will be followed in quick succession by another. In some embodiments pre-emphasis filtering could also be used to exaggerate and anticipate the rising edges of the signal.

The signal selection controller 212 monitors 303 the signal indicative of the amplitude of the input signal, e.g. the envelope value. The controller 212 may for example compare the signal ENV to at least one predetermined threshold value to determine automatically whether to enter the open loop mode (second mode) or closed loop mode (first mode).

There may be a single amplitude threshold or there may be different amplitude thresholds: one threshold for changing from the first to the second mode; and another, different threshold for changing from the second to the first mode so as to apply hysteresis to the mode changes.

If the amplitude of the signal relative to the relevant predetermined threshold is unchanged then the mode of operation is unchanged and the signal selection controller continues to monitor 303 the indicative signal ENV.

If the indicative signal ENV falls below the relevant predetermined threshold, then the signal selection controller 212 will decide to enter into open loop mode (i.e. the second mode) as in step 304. In this example the gain applied by a variable gain element in the first signal path, such as multiplier 213, is ramped down from the first gain setting to zero in step 305. A predetermined gain ramp will be applied over a relatively short period of time but a sufficient period of time not to cause significant transients in the output signal. Once the gain has reached zero, the ADC 207 and/or the loop filter 211 may be disabled in step 306. Disabling the ADC and/or loop filter when not required helps save power and increase the efficiency of the amplifier circuit. The selector module 210 may also be put into pass-through mode in step 307 so as to just use the input signal from the second signal path. By allowing the gain applied by the variable gain element 213 to ramp to zero before disabling the ADC or putting the selector module into pass-through mode, reduces any gross transients and thus output signal artefacts which would be caused by just suddenly disabling the ADC or switching, i.e. step-changing, the selector module into pass-through mode. It should be noted that both of steps 306 and 307 are optional and one or both steps may not be used in some embodiments. Also the order of steps 306 and 307 could be reversed. In addition the step 306 of disabling a component such as the loop filter may in some embodiments only be implemented if the signal amplitude remains low for a certain time period and/or if the signal amplitude drops below another lower threshold. It may take time and/or power to re-enable the loop filter and thus it may be disabled only in instance when it is likely to be disabled for more than a very short time.

Referring back to step 303, if the indicative signal ENV goes above the relevant predetermined threshold the signal selection controller 212 will decide to enter into the closed loop mode (first mode) as in step 308. In this example the ADC 207 and/or loop filter 211 is first enabled in step 309. This may involve waiting a short period of time to allow the ADC/loop filter to settle. As the amplifier circuit is still in open-loop mode at this stage, the gain applied by the variable gain element, e.g. multiplier 213 will already be set at zero—although if the loop filter 211 is the variable gain element and has been disabled it should be re-enabled with a gain of zero. If the filter 211 has been operational it may have a non-zero output which is likely to be incorrect and thus the output of the loop filter 211 may be reset to zero. In step 311 the selector module is put into the combiner state where it combines the signals from the first and second signal paths. However, as the gain applied to the first signal path is still zero, at this stage there is no contribution from the first signal path and thus no transient. In step 312, the gain applied by the variable gain element, e.g. multiplier 213 is then ramped up to the nominal first gain setting for the first signal path, the ramp being applied over a suitable time frame to avoid any significant transients. Similar to that described above, this control by the signal selection controller 212 helps to reduce any gross transients and thus signal artefacts in the signal which may otherwise be audible.

To further reduce any transients occurring on transition between modes the signal selector controller 212 may be configured to only initiate a transition between modes when the instantaneous value of the input signal is at or below a low magnitude level or threshold, e.g. at or near zero. The amplifier circuit may comprise a low-level detector such as a zero crossing detector to detect a low instantaneous signal magnitude and the signal selector controller may wait for a zero crossing to initiate a transition between modes.

In open-loop mode, the amplifier gain from Din to Vout is defined by the gain of the digital modulator and output driver and the gains of any other elements included in the signal path from Din to Vout. In closed-loop mode, the gain from Din to Vout is defined by the inverse of the conversion gain of the ADC and similar allowances for any gain scaling in the signal paths from Vout and Din to the subtractor 208, independently of the value of gain of the variable gain element in the loop filter path provided the open-loop gain is adequately high. These open-loop and closed-loop amplifier gains may be designed, calibrated or continuously adjusted in use to be nominally equal. However any signal artefacts due to mismatch in the amplifier gain from Din to Vout between first and second modes will also be reduced by the gradual controlled transition or ramp of the variable gain.

As mentioned above the embodiments of the invention can be implemented with ADCs that consume less space and/or power than the ADCs used in conventional amplifier circuits without a corresponding decrease in amplifier noise performance.

Figure 4:
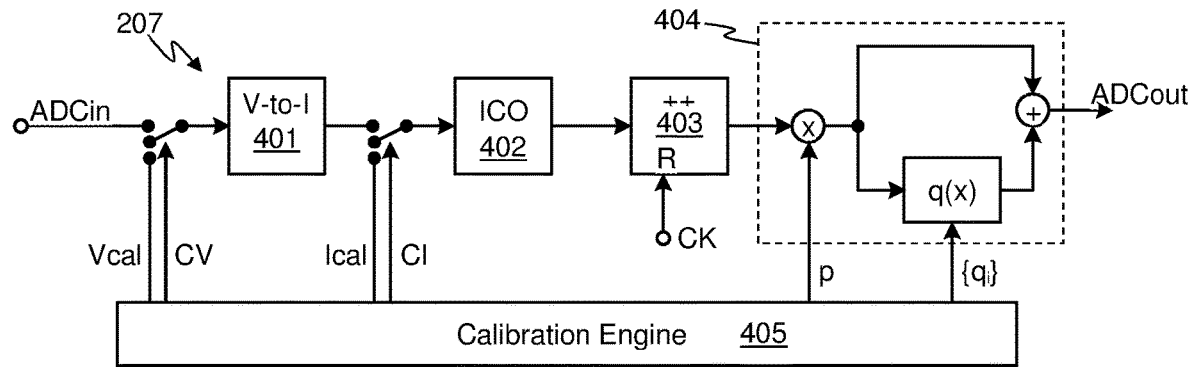
FIG. 4 illustrates an example of an analogue to digital converter suitable for use in an embodiment of the invention.

FIG. 4 illustrates an example of an ADC 207 according to an embodiment of the invention. In this example the ADC 207 comprises a voltage-to-current conversion block 401 and a current controlled oscillator 402. The number of pulses of the output of the current-controlled oscillator 402 is counted by a counter 403. The counter output is outputted, via calibration block 404, as the ADC output signal. The transfer function of this current-controlled circuit is more immune to process and temperature than a voltage-controlled circuit.

Figure 5:
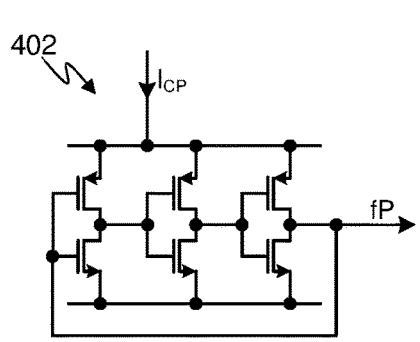
FIG. 5 illustrates an example of a current controlled oscillator.

As shown in FIG. 5, the current-controlled oscillator 402 may be implemented by a simple ring oscillator of CMOS inverters as will be appreciated by one skilled in the art.

The conversion gain of the current-controlled oscillator 402 is process dependent and may be adjusted by calibration on start-up under the control of a calibration engine 405. This will generate an overall gain correction factor p and/or a polynomial correction via the coefficients $q_i$ which can be applied by the calibration block 404.

The ADC 207 noise characteristics may thus dominate the overall amplifier noise performance in closed loop mode, but as closed loop mode is only used at high signal amplitudes the noise floor is not so significant. For low signal levels open loop mode is used and the digital modulator performance thus defines system performance in terms of noise.

Figure 6:
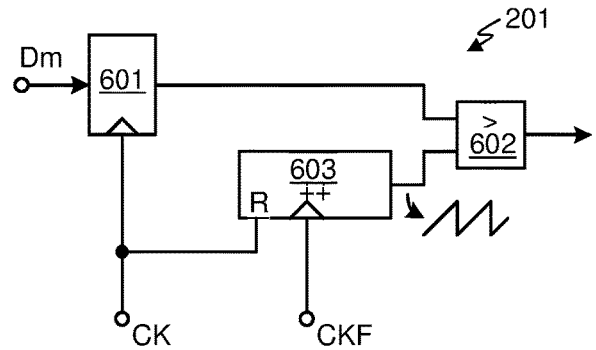
FIG. 6 illustrates an example of a digital modulator.

The digital modulator 201 could, for example as illustrated in FIG. 6, be a simple digital ramp modulator. The modulator input signal Dm may be latched, i.e. temporarily stored, in a storage element such as a clocked register 601 that is controlled by a clock signal CK. The output of the storage element 601 is compared by a digital comparator 602 with the output signal of a counter 603. The counter 603 is supplied with the clock signal CK supplied to the register 601 and a relatively faster clock signal CKF and produces a digital ramp signal as will be understood by those skilled in the art. The digital ramp signal output from the counter 603 will be a PWM-type signal with a cycle period defined by the relatively slower clock signal CK and with a pulse timing resolution defined by the fast clock CKF. It will of course be appreciated that a closed-loop ramp modulator, or a hysteretic, self-oscillating modulator could be implemented if desired.

Figure 7:
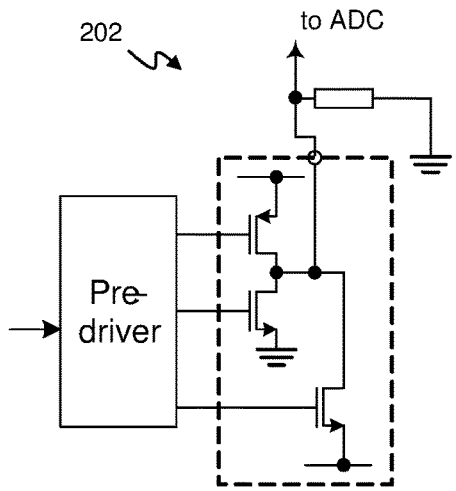
FIG. 7 illustrates an example of an output driver stage suitable for use in an embodiment of the invention.

As mentioned above the output stage may be any suitable Class D output stage. FIG. 7 illustrates one example of an output driver stage 202 that could be implemented in an embodiment of the invention. In this embodiment the output driver stage 202 comprises a pre-driver and a Class-D three-level half-bridge. It will be appreciated that a 2-level half bridge or a 2 or 3-level full bridge could be implemented instead.

The use of the 3-level half bridge has the advantage that for small signals the output is at ground for the majority of the time. Thus the availability of the ground signal may reduce the EMI and switching power consumption and may improve the power supply rejection of the output driver stage 202.

Figure 8:
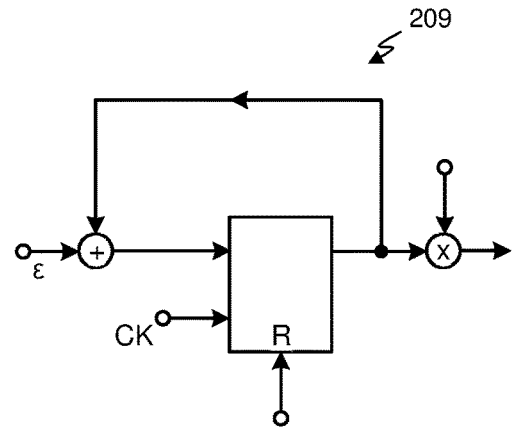
FIG. 8 illustrates an example of a loop filter suitable for use in an embodiment of the invention.

FIG. 8 illustrates an example of a loop filter 209 according to an embodiment of the invention. This is an example of a digital integrator loop filter where the integrator time constant may be changed by varying α. This effectively changes the gain applied by the loop filter to the error signal ε. It will be appreciated that a second order loop filter could also be used.

Figure 9:
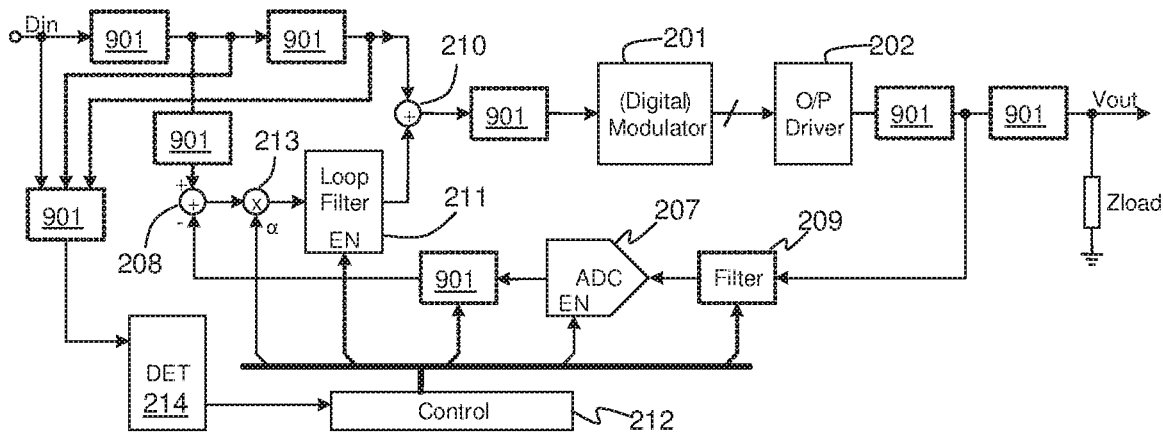
FIG. 9 illustrates a Class D amplifier circuit according to another embodiment of the invention.

FIG. 9 illustrates a Class D amplifier circuit according to an embodiment of the invention. In this figure the components which are similar to those described with reference to FIG. 2 have been given the same references.

As can be seen multiple signal conditioning blocks 901 may be implemented in the various signal paths and at various different places within the amplifier circuit. These signal conditioning blocks 901 may comprise various signal conditioning circuits and perform various signal conditioning functions as will be readily appreciated and understood by one skilled in the art. A non-exhaustive list of examples of such signal conditioning blocks that may be used in various configurations and combinations include: filter blocks (High Pass/Low Pass/Band Pass etc.); gain blocks; attenuation blocks; up-samplers; down-samplers; interpolators; word-length reduction/increase blocks etc. Furthermore, in this embodiment the positions of the variable gain element 213 and the loop filter 211 have been optionally reversed.

Other intermediate operations could also be included. For example, if a speaker is acting as a load receiving the analogue output signal Vout, the Class D amplifier circuit may include a speaker voice coil excursion limiting function. The impedance of the coil may be extracted based on the voice coil current and voltage and from this the excursion of the voice coil can be estimated. Alternatively, the voice coil excursion may be predicted from the input digital signal and a predefined or calibrated electro-mechanical model of the voice coil. If the excursion of the voice coil indicates that there is a risk of causing mechanical damage or overheating of the speaker, the digital input signal may be attenuated.

Furthermore, in addition to the normal control mechanisms described above with reference to FIGS. 2 and 3, there may be other conditions in which the open loop mode of operation is desirable. For example these may include fault conditions in which the output appears to be unexpectedly overloaded or the loop appears to be oscillating or locking-up, perhaps due to a gross EMI event. Thus, the envelope detector 214 may also receive signals from the digital modulator 201, the loop filter 211 or the output node via the ADC indicating that there is some clipping at a particular node or another fault condition has occurred.

Figure 10:
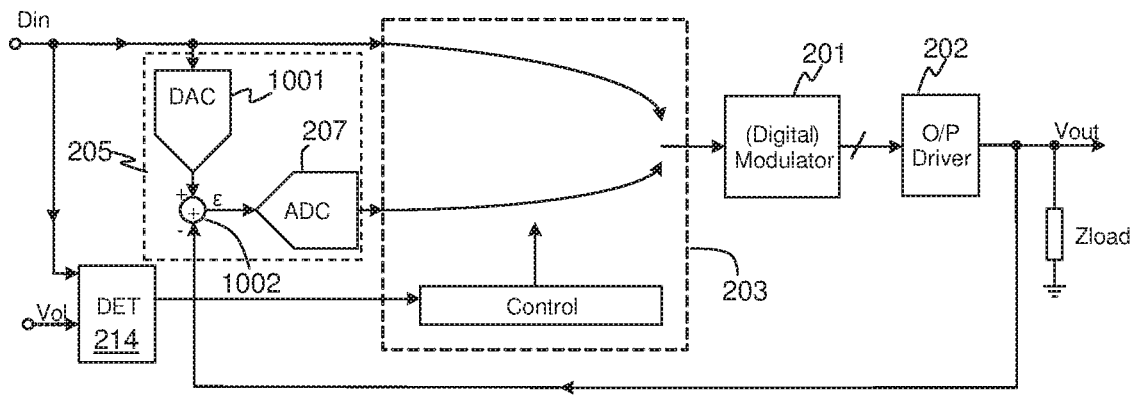
FIG. 10 illustrates a Class D amplifier circuit according to a further embodiment of the invention.

FIG. 10 illustrates a Class D amplifier circuit according to an embodiment of the invention. In this figure the components which are similar to those described with reference to FIG. 2 have been given the same references.

In this embodiment the error block 205 comprises a digital to analogue converter (DAC) 1001 which receives the digital input signal and outputs an analogue signal representative of the digital input signal which is input into analogue subtractor 1002 along with the output signal Vout. The ADC 207 has been repositioned to receive the signal from the output of the analogue subtractor 1002. This has the advantage that, as the ADC now only has to receive the analogue error signal, which is likely to be a relatively small signal, the requirements of the ADC can be relaxed even more than in the embodiment described in reference to FIG. 2.

Figure 11:
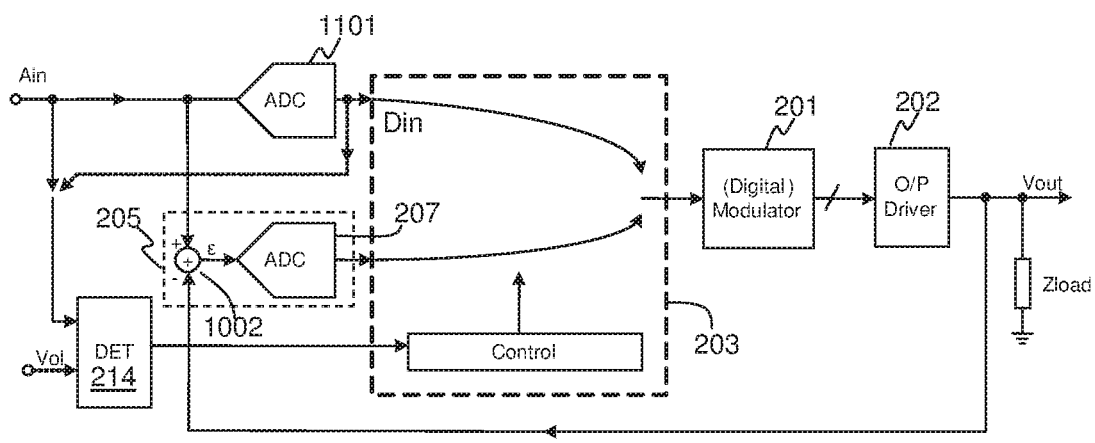
FIG. 11 illustrates a Class D amplifier circuit according to a yet further embodiment of the invention.

FIG. 11 illustrates a Class D amplifier circuit according to an embodiment of the invention. In this figure the components which are similar to those described with reference to FIG. 2 have been given the same references.

In this embodiment, the input signal is an analogue input signal Ain.

The analogue input signal Ain may be supplied to a main signal path 1101 which outputs a digital input signal Din, representative of the analogue input signal Ain. This digital input signal is supplied to the signal selector block 203 as the digital input signal.

In this example, the error block 205 receives the analogue input signal Ain instead of the digital input signal Din. Ain is input into the analogue subtractor 1002 along with the analogue output signal Vout.

Similar to the embodiment described in reference to FIG. 10, the ADC 207 has been repositioned to receive the error signal from the output of the analogue subtractor 1002.

The envelope detector 214 may be an analogue envelope detector which receives the analogue input signal Ain or it may receive the digital version Din generated by ADC 1101.

Figure 12:
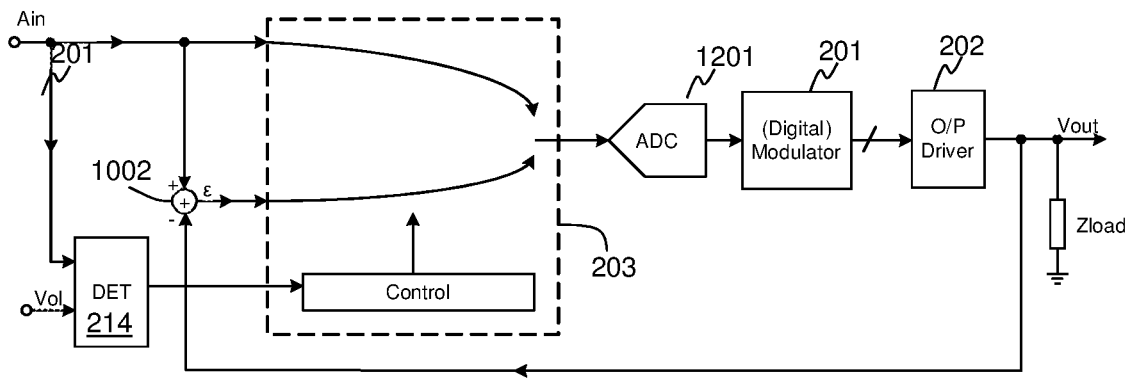
FIG. 12 illustrates a Class D amplifier circuit according to another embodiment of the invention.

FIG. 12 illustrates a Class D amplifier according to an embodiment of the invention. In this figure the components which are similar to those described with reference to FIG. 2 have been given the same references.

In this embodiment the error block only comprises an analogue subtractor 1002 and receives an analogue input signal Ain and the analogue output signal Vout. The error signal generated is therefore analogue and the signal selector block 203 receives the analogue input signal and the analogue error signal. An ADC 1201 is then positioned to receive the output of the signal selector block, which functions similar to as described in reference to FIG. 2 except implementing analogue components, and outputs a digital signal for inputting into the digital modulator 201.

As mentioned above Class D amplifier circuits according to embodiments of the present invention are particular suitable for use in portable devices such as mobile telephone or laptop, notebook or tablet computing devices of the like.

Figure 13:
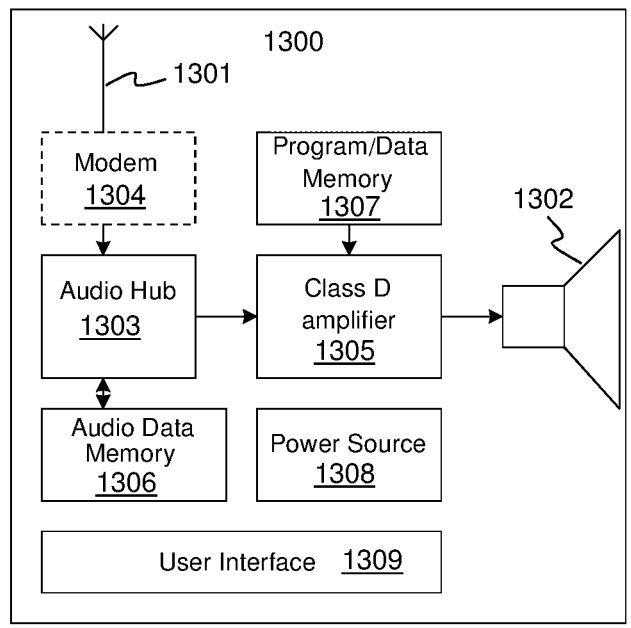
FIG. 13 illustrates a device having a Class D amplifier circuit according to an embodiment of the invention.

FIG. 13 illustrates a device 1300 comprising a Class D amplifier circuit according to an embodiment of the invention. The device may have wireless communication capability and may for example receive transmissions via an antenna 1301. The device has at least one speaker 1302. It will be appreciated that there may be more than one antenna and more than one speaker present. An audio hub 1303 receives audio signals from a number of possible sources. For instance the audio hub 1303, i.e. an audio codec, may receive signals from a modem 1304 which may encode received signals from the antenna into a digital format. The audio hub 1303 may pass such received audio signals on to a Class D amplifier 1305 according to the present invention which outputs an analogue signal to be input into the speaker 1302. Additionally or alternatively audio data may be received at the audio hub 1303 from an audio data memory 1306. Additionally or alternatively the Class D amplifier may in some instance be supplied with signal data, coefficient data or software code stored in a program/data memory 1307. This memory may for example be EEPROM or static RAM and to store the data or code in a persistent or non-transitory form. The device may contain a power source 1308 and a form of user interface 1309 which may be a keypad, a touch screen, or an external controller. The device may be a portable device such as an mp3 player or portable computer, or a portable communications device for example a cellphone or tablet.

As used herein the term block refers to a functional unit or module which may be implemented by one or more circuit components and which may for instance comprise dedicated circuitry. A block may additionally or alternatively comprise one or more software modules running, for instance on a general purpose processor or suitably programmed FPGA array or the like. The components of a block do not need to be physically co-located and the components of one block may in some applications be shared with components of another block.

In terms of the signal selection block it will be appreciated that the inputs to the signal selection block do not have to be a defined terminal of the amplifier circuit and an input to the relevant block could simply be any node along a relevant signal path leading to the components forming the block.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Additionally the term "gain" does not exclude "attenuation" and vice-versa. Any reference numerals or labels in the claims shall not be construed so as to limit their scope.

The invention claimed is:

1. A Class-D amplifier circuit for amplifying an input signal comprising:
   a controller configured to control the Class-D amplifier circuit to selectively transition between an open-loop operational mode and a closed-loop operational mode based on indication of amplitude of said input signal;
   a class-D output stage;
   a modulator for generating at least one control signal for controlling switching of a said class-D output stage wherein the controller comprises a signal selector configured such that in the closed-loop operational mode an input to the modulator is based on the input signal combined with a feedback signal and in the open-loop operational mode the input to the modulator is based on the input signal with no contribution from the feedback signal; and
   an error block for generating an error signal based on the input signal and the feedback signal wherein the signal selector is configured to select the error signal as the input to the modulator in the closed-loop operational mode.

2. The Class-D amplifier circuit as claimed in claim 1, wherein the controller is configured to control the Class-D amplifier circuit in the open-loop operational mode if the indication of the amplitude of the digital input signal is below a first amplitude threshold and to control the Class-D amplifier circuit in the closed-loop operational mode if the indication of the amplitude of the digital input signal is above said first amplitude threshold.

3. The Class-D amplifier circuit as claimed in claim 1, comprising a forward signal path configured to receive the input signal and a feedback path wherein the controller comprises the signal selector for controlling an extent to which a signal in the feedback path contributes to the forward signal path.

4. The Class-D amplifier circuit as claimed in claim 1, wherein the error block comprises an analogue to digital converter coupled to receive the feedback signal and wherein said signal selector is configured to enable the analogue to digital converter in the closed-loop operational mode and disable the analogue to digital converter in the open-loop operational mode.

5. The Class-D amplifier circuit as claimed in claim 1, comprising at least one variable gain element for applying a variable gain to the feedback signal or the error signal wherein the signal selector is a controller that is configured to control the at least one variable gain element to provide a first non-zero gain setting in the closed-loop operational mode and a second gain setting of zero in the open-loop operational mode.

6. The Class-D amplifier circuit as claimed in claim 5, wherein said controller is configured to control the at least one variable gain element to provide a controlled transition in gain between said first and second gain settings that involves at least one intermediate gain setting.

7. The Class-D amplifier circuit as claimed in claim 6, wherein said controlled transition in gain comprises a ramp in gain.

8. The Class-D amplifier circuit as claimed in claim 7, wherein said at least one variable gain element comprises a loop filter having a variable gain.

9. The Class-D amplifier circuit as claimed in claim 8, wherein the loop filter comprises an integrator and the controller is configured to control the integrator time constant of said integrator to vary the gain of the loop filter.

10. The Class-D amplifier circuit as claimed in claim 1, further comprising an envelope detector for determining an envelope value for the input signal wherein signal selection controller is configured to use said envelope value as the indication of amplitude of the digital input signal.

11. The Class-D amplifier circuit as claimed in claim 10, wherein the envelope detector is configured to apply a predetermined delay between any detected drop in signal amplitude and a reduction in the envelope value.

12. The Class-D amplifier circuit as claimed in claim 1, wherein the controller is configured to initiate any transition between the open-loop operational mode and the closed-loop operational mode at a zero-crossing of the input signal.

13. The Class-D amplifier circuit as claimed in claim 12, comprising a zero-crossing detector for detecting a zero-crossing of the input signal.

14. An electronic apparatus comprising a Class D amplifier circuit as claimed in claim 1.

15. The electronic apparatus as claimed in claim 14, wherein said electronic apparatus is at least one of: a portable device; a battery power device; a computing device; a communications device; a gaming device; a mobile telephone; a personal media player; a laptop, tablet or notebook computing device.

16. A Class-D amplifier circuit for amplifying an input signal comprising:
- a controller configured to control the Class-D amplifier circuit to selectively transition between an open-loop operational mode and a closed-loop operational mode based on indication of amplitude of said input signal; and
- an envelope detector for determining an envelope value of said input signal wherein the controller is configured to use said envelope value as the indication of amplitude of said input signal.

17. A Class-D amplifier circuit for amplifying an input signal comprising a controller configured to control the Class-D amplifier circuit to selectively transition between an open-loop operational mode and a closed-loop operational mode based on an indication of amplitude of said input signal, wherein the controller is configured to initiate any transition between the open-loop operational mode and the closed-loop operational mode at a zero-crossing of said input signal.

* * * * *